(12) United States Patent
Mountsier et al.

(10) Patent No.: US 9,418,889 B2
(45) Date of Patent: Aug. 16, 2016

(54) SELECTIVE FORMATION OF DIELECTRIC BARRIERS FOR METAL INTERCONNECTS IN SEMICONDUCTOR DEVICES

(71) Applicant: Lam Research Corporation, Fremont, CA (US)

(72) Inventors: Thomas Weller Mountsier, San Jose, CA (US); Hui-Jung Wu, Pleasanton, CA (US); Bhadri N. Varadarajan, Beaverton, OR (US); Nagraj Shankar, Tualatin, OR (US); William T. Lee, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/742,180

(22) Filed: Jun. 17, 2015

(65) Prior Publication Data

US 2015/0380302 A1 Dec. 31, 2015

Related U.S. Application Data

(60) Provisional application No. 62/018,872, filed on Jun. 30, 2014.

(51) Int. Cl.
| | |
|---|---|
| *H01L 21/44* | (2006.01) |
| *H01L 21/768* | (2006.01) |
| *H01L 21/02* | (2006.01) |
| *H01L 23/532* | (2006.01) |

(52) U.S. Cl.
CPC ...... *H01L 21/76831* (2013.01); *H01L 21/0217* (2013.01); *H01L 21/02167* (2013.01); *H01L 21/02178* (2013.01); *H01L 21/02211* (2013.01); *H01L 21/02274* (2013.01); *H01L 21/02362* (2013.01); *H01L 21/76843* (2013.01); *H01L 21/76877* (2013.01); *H01L 23/53238* (2013.01); *H01L 23/53295* (2013.01); *H01L 2924/0002* (2013.01)

(58) Field of Classification Search
CPC .................. H01L 21/76831; H01L 21/02167; H01L 21/0217
See application file for complete search history.

(56) References Cited

U.S. PATENT DOCUMENTS

| | | | |
|---|---|---|---|
| 6,008,117 A | 12/1999 | Hong et al. | |
| 6,077,774 A * | 6/2000 | Hong | ................ H01L 21/76828 257/751 |
| 6,553,933 B2 | 4/2003 | Powell et al. | |
| 6,616,985 B2 | 9/2003 | Powell et al. | |
| 6,794,288 B1 | 9/2004 | Kolics et al. | |
| 6,878,402 B2 | 4/2005 | Chiang et al. | |
| 7,368,377 B2 * | 5/2008 | Whelan | .................. B82Y 30/00 257/E21.171 |
| 7,727,882 B1 | 6/2010 | Wu et al. | |
| 8,192,806 B1 | 6/2012 | Varadarajan et al. | |
| 2009/0163025 A1 | 6/2009 | Humayun et al. | |

* cited by examiner

*Primary Examiner* — Bradley K Smith
(74) *Attorney, Agent, or Firm* — Weaver Austin Villeneuve & Sampson LLP (57) ABSTRACT

A dielectric diffusion barrier is deposited on a substrate that has a via and an overlying trench etched into an exposed layer of inter-layer dielectric, wherein there is exposed metal from the underlying interconnect at the bottom of the via. In order to provide a conductive path from the underlying metallization layer to the metallization layer that is being formed over it, the dielectric diffusion barrier is formed selectively on the inter-layer dielectric and not on the exposed metal at the bottom of the via. In one example a dielectric SiNC diffusion barrier layer is selectively deposited on the inter-layer dielectric using a remote plasma deposition and a precursor that contains both silicon and nitrogen atoms. Generally, a variety of dielectric diffusion barrier materials with dielectric constants of between about 3.0-20.0 can be selectively formed on inter-layer dielectric.

20 Claims, 9 Drawing Sheets

SELECTIVE FORMATION OF DIELECTRIC BARRIERS FOR METAL INTERCONNECTS IN SEMICONDUCTOR DEVICES

CROSS REFERENCE TO RELATED PATENT APPLICATION

This application claims the benefit of U.S. Provisional Application Ser. No. 62/018,872, filed Jun. 30, 2014, by Mountsier et al., and titled "Selective Formation of Dielectric Barriers for Metal Interconnects in Semiconductor Devices", which is herein incorporated by reference in its entirety and for all purposes.

FIELD OF THE INVENTION

The present invention pertains to methods of forming layers of material during semiconductor processing. Specifically, the invention pertains to methods for selectively forming dielectric barriers for metal interconnects.

BACKGROUND OF THE INVENTION

Damascene processing is a method for forming interconnects on integrated circuits. It involves formation of inlaid metal wires in trenches and vias etched into a dielectric layer (inter layer dielectric or ILD). Damascene processing is often a preferred integration method because it requires fewer processing steps than other methods and offers a higher yield. It is also particularly well-suited to metals such as copper that cannot be readily patterned by plasma etching.

In a typical Damascene process flow, copper is deposited onto a patterned dielectric to fill the vias and trenches etched into the dielectric layer. The resulting metallization layer is typically formed either directly on a layer carrying active devices, or on a lower-lying metallization layer. Prior to filling with copper, the vias and trenches are lined with a thin layer of barrier material that prevents copper from diffusing into the ILD layer. Traditionally, conductive metal-based materials, such as tantalum, titanium and their nitrides, were used as in-feature diffusion barriers. Alternatively, as provided in the embodiments presented herein, non-conducting, dielectric-based diffusion barriers can be used. In a typical integrated circuit (IC), multiple interconnect levels are stacked on top of each other, where metal-filled vias and trenches serve as conducting paths between the active and passive elements in the IC. Within each metallization level lines (or wires) transmit signals horizontally across the circuit and vias allow signals to pass vertically, from level to level.

Fabrication of these interconnects presents several challenges, which become more and more significant as the dimensions of IC device features continue to shrink. Some of these challenges are addressed herein by providing dielectric rather than conductive in-via diffusion barrier layers.

SUMMARY OF THE INVENTION

In various implementations, methods, apparatus and systems for forming dielectric-based copper diffusion barriers (or barriers preventing diffusion of other metals into ILD) are provided. The typical substrate on which the dielectric diffusion barrier is deposited has a via and an overlying trench etched into an exposed layer of ILD, wherein there is exposed metal from the underlying interconnect at the bottom of the via. In order to provide a conductive path from the underlying metallization layer to the metallization layer that is being formed over it, the dielectric diffusion barrier must be formed selectively on the ILD layer and not on the exposed metal at the bottom of the via.

Selective formation of the dielectric diffusion barrier may be a single-step or a multi-step process. In one implementation of a selective formation, the dielectric diffusion barrier is deposited on the ILD layer and is not deposited on the metal layer at the via bottom. The selectivity can be achieved by one or more of (i) using diffusion barrier deposition precursors configured for selective deposition on an ILD layer; (ii) using deposition process parameters configured for selective deposition; (iii) activating the ILD towards deposition; (iv) passivating the metal against deposition (e.g., by nitridation), and (v) a combination of these methods. In another implementation of a selective formation, the dielectric diffusion barrier is deposited on the ILD layer at a greater thickness than on the metal, and then subsequently removed from the metal, without being fully removed from the ILD layer. The partial selectivity during deposition (thickness difference) can be similarly achieved by one or more of (i) using diffusion barrier deposition precursors that preferentially result in deposition on an ILD layer; (ii) using deposition process parameters configured for preferential deposition on an ILD layer; (iii) activating the ILD towards deposition; (iv) passivating the metal against deposition (e.g., by nitridation), and (v) a combination of these methods.

In some implementations, a method is provided that includes: (a) selectively forming a dielectric diffusion barrier on the ILD layer of a substrate having a via and an overlying trench etched into an ILD layer, wherein there is a metal from the underlying interconnect level exposed at the bottom of the via; (b) filling the via and the trench with a metal (e.g., copper, cobalt, nickel, tungsten, or an alloy of these metals), such that the filling metal is in contact with the metal at the bottom of the via; and (c) removing excess metal if it is present on the field region of the substrate. Optionally, a conductive liner, e.g., a ruthenium liner is formed conformally over the dielectric diffusion barrier formed in (a) prior to filling of recessed features in (b) to improve adhesion between these layers.

The deposited dielectric diffusion barrier layer is made of a material that is capable of preventing diffusion of metal (e.g., copper, cobalt, nickel, tungsten, or an alloy of these metals) into the ILD layer. In some embodiments, the dielectric diffusion barrier layer is also configured for preventing moisture or other contaminants from migrating into the metal-filled line and via from the ILD. Suitable dielectric diffusion barrier layers are non-porous, mechanically robust materials that typically have a dielectric constant that is somewhat higher than the dielectric constant of the surrounding ILD layer. For example, materials with dielectric constants of between about 3.0-20.0, more preferably between about 3.5-8.0 can be used.

Examples of suitable dielectric materials include without limitation, doped or undoped silicon carbide (e.g., SiC, SiCN, SiCO), doped or undoped silicon nitride, boron-containing dielectrics (e.g., BC, SiBC, BCN, etc.), metal oxides (e.g., $TiO_x$), metal silicates (e.g., $MnSiO_x$), metal carbides (e.g., WC), metal nitrides (e.g., AlN), and metal carbonitrides (e.g., WCN). It is noted that partially conductive metal nitrides, such as conductive TiN, and TaN that are traditionally used as diffusion barrier layers, are excluded from the provided embodiments.

Dielectric diffusion barrier layers can be deposited using a variety of methods including but not limited to thermal chemical vapor deposition (CVD), plasma-enhanced chemical vapor deposition (PECVD), atomic layer deposition (ALD), and sputtering or physical vapor deposition (PVD).

In some embodiments, selective formation of dielectric diffusion barrier layers is performed by methods that minimize plasma exposure damage to the ILD layer, which is often made of a chemically and mechanically weak material, such as a porous, carbon-doped, silicon oxide based material. These methods do not employ high-energy ions in the vicinity of the substrate, and include remote plasma PECVD, low power PECVD, thermal CVD, thermal ALD and the like.

In some embodiments provided methods are integrated into the processing scheme that includes photolithographic patterning and further includes: applying photoresist to the substrate; exposing the photoresist to light; patterning the photoresist and transferring the pattern to the substrate; and selectively removing the photoresist from the substrate.

In another aspect, an apparatus for selectively forming the dielectric diffusion barrier layer is provided. The apparatus includes a process chamber and a controller containing program instructions for performing any of the methods provided herein.

In some embodiments, a system is provided, wherein the system includes the apparatus described herein and a stepper.

In another aspect, a non-transitory computer machine-readable medium is provided, where the medium includes program instructions for a deposition apparatus containing code for performing any of the operations of the methods described herein.

These and other features and advantages of the present invention will be described in more detail below with reference to the associated drawings.

DETAILED DESCRIPTION OF PREFERRED EMBODIMENTS

In a conventional Damascene process, metal-based diffusion barrier layers (e.g., Ta/TaN bilayer or Ti/TiN bilayer) are applied to the via and trench sidewalls to prevent diffusion from copper-filled features into a surrounding ILD layer. With ongoing miniaturization of IC devices, recessed feature sizes (sizes of vias and trenches) continue to shrink. Correspondingly, with each advancing technology node, the barrier thickness in-feature was reduced in order to maintain the maximum possible copper wire cross-section. However the thickness of the diffusion barrier layer could not be reduced indefinitely. Below a certain thickness, the barrier layer ceases to serve as an effective barrier. Further, metal-based diffusion barrier layers are typically deposited by physical vapor deposition (PVD), which is a method that makes conformal deposition of diffusion barriers difficult. PVD films generally exhibit an overhang and re-entrant profile at feature openings that interfere with subsequent copper filling. Once the minimum barrier thickness limit is reached, the barrier material will consume an ever increasing fraction of copper conductor cross-section as feature size continues to shrink. Because the resistance of the metal-based barrier is greater than that of copper, the overall line and via resistances will suffer.

In the implementations provided herein, a dielectric diffusion barrier is used as an alternative to a conventionally used conductive barrier. The use of dielectric diffusion barrier would preserve maximum conductor cross-section and instead will consume ILD spacing by displacing a portion of the low-k dielectric material between metal lines. Most dielectric barrier materials will have a dielectric constant (k) that is greater than the dielectric constant of the surrounding ILD, leading to increased line capacitance. However due to dispersion of electric field above and below the lines, the impact will be muted. Furthermore, as a result of the etch step, the first few nanometers of the ILD is damaged and has higher k. Replacing this with a purposefully-deposited dielectric barrier layer could result in no effective k value (and capacitance) increase around the conductor. By the use of appropriate dielectric barrier material the beneficial reduction in resistance (R) can exceed the increase in capacitance (C) with a net decrease in the resistance-capacitance delay (RC).

One of the key challenges to integrating a dielectric-based diffusion barrier into the Damascene process flow is achieving electric continuity between successive wiring levels (metallization layers). Most of the processes used for growing dielectric films deposit material on all exposed surfaces, including the surface at the via bottom, where the two metal levels are supposed to come into electrical contact. Consequently, the dielectric material in the via bottom contact region must be removed prior to metallization. However, this material removal must be accomplished without degradation of the dielectric barrier layer in other parts of the substrate (via sidewall, trench sidewall and especially trench bottom).

To address this problem, methods for selectively forming dielectric barrier on ILD surfaces in the presence of exposed metal are provided. Selective formation of the dielectric diffusion barrier may be a single-step or a multi-step process. In one implementation of a selective formation, the dielectric diffusion barrier is deposited on the ILD layer (e.g., at the via and trench sidewalls, at the trench bottom and in the field region) and is not deposited on the metal layer at the via bottom. The selectivity can be achieved by (i) using diffusion barrier deposition precursors configured for selective deposition on an ILD layer; (ii) using deposition process parameters configured for selective deposition; (iii) activating the ILD towards deposition; (iv) passivating the metal towards deposition (e.g., by nitridation), or (v) a combination of these methods.

In another implementation of a selective formation, the dielectric diffusion barrier is deposited on the ILD layer to a greater thickness than on the metal (also referred to here as non-conformal deposition), and is then removed from the metal, without being fully removed from the ILD layer. For example, the dielectric barrier material may be deposited to a greater thickness over ILD (e.g., at the trench bottom) than over metal (at the via bottom), and may then be removed from the bottom of the via to expose the metal, without being fully removed from the ILD. It is understood that in some implementations it may not be necessary for the dielectric barrier material to be deposited to a greater thickness on all ILD surfaces than on the metal surfaces. For example, the via sidewall coverage over ILD, in some implementations, does not need to be greater than via bottom coverage over metal, because certain etching processes can more effectively remove material from horizontal surfaces than from vertical surfaces, thereby providing the necessary selectivity. The partial selectivity during deposition (thickness difference) can be similarly achieved by (i) using diffusion barrier deposition precursors that preferentially result in deposition on an ILD layer; (ii) using deposition process parameters configured for preferential deposition on an ILD layer; (iii) activating the ILD towards deposition; (iv) passivating the metal towards deposition (e.g., by nitridation), or (v) a combination of these methods.

Methods provided herein can be used to form dielectric barriers at the interface between an ILD layer and a variety of metals (e.g., copper, cobalt, nickel, tungsten, or an alloy of these metals). While provided methods can be used to process substrates with recessed features (vias and trenches) of a variety of sizes, they are particularly suitable for building narrow metal wires. In some implementations, the width of the metal wire (both in the via and the trench) formed by these methods is between about 5-45 nm, such as between about 12-25 nm.

Typically suitable dielectric diffusion barrier layers are non-porous mechanically robust materials that have a dielectric constant that is somewhat higher than the dielectric constant of the surrounding ILD layer. For example, materials with dielectric constants of between about 3.0-20.0, more preferably between about 3.5-8.0 can be used.

The suitable thicknesses of dielectric diffusion barrier layers depend on the specific properties of the barrier material, including its dielectric constant and its diffusion barrier properties. In general barrier layers having thicknesses of between about 5-50 Å can be formed.

Examples of suitable dielectric materials include without limitation, doped or undoped silicon carbide (e.g., SiC, SiCN, SiCO), doped or undoped silicon nitride, boron-containing dielectrics (e.g., BC, SiBC, BCN, etc.), metal oxides (e.g., $TiO_x$), metal silicates (e.g., $MnSiO_x$), metal carbides (e.g., WC), metal nitrides (e.g., AlN), and metal carbonitrides (e.g., WCN).

Dielectric diffusion barrier layers can be deposited using a variety of methods including but not limited to thermal chemical vapor deposition (CVD), plasma-enhanced chemical vapor deposition (PECVD), atomic layer deposition (ALD, and sputtering or physical vapor deposition (PVD).

Figure 1A:
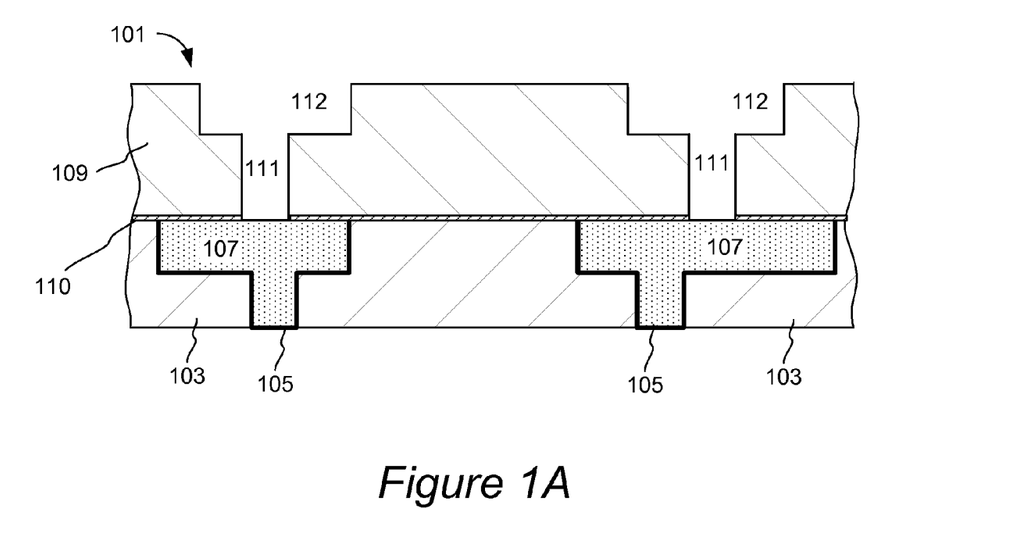
FIGS. 1A-1C show cross-sectional depictions of IC device structures created during device fabrication process, according to an embodiment provided herein.
Figure 1B:
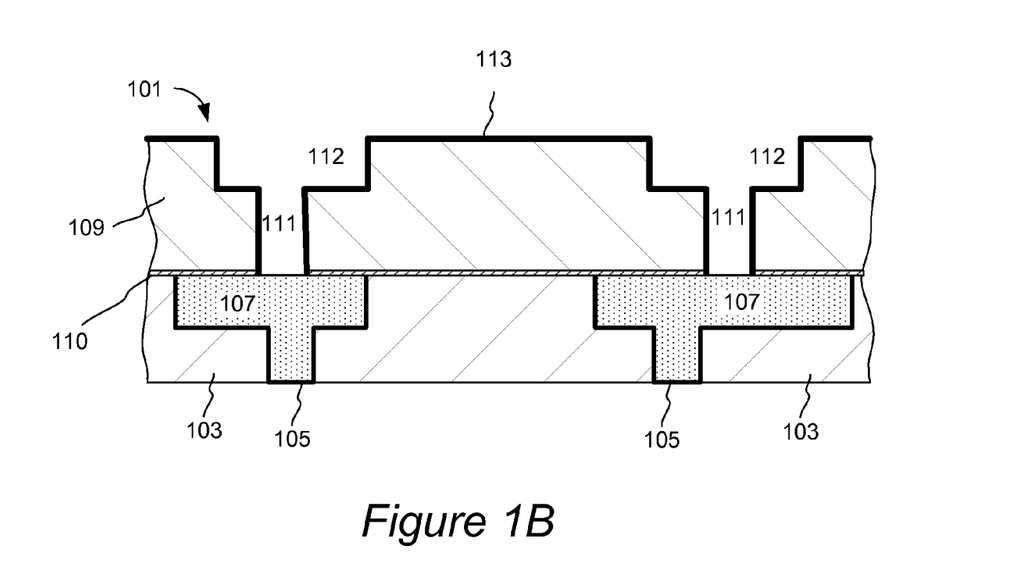
Figure 1C:
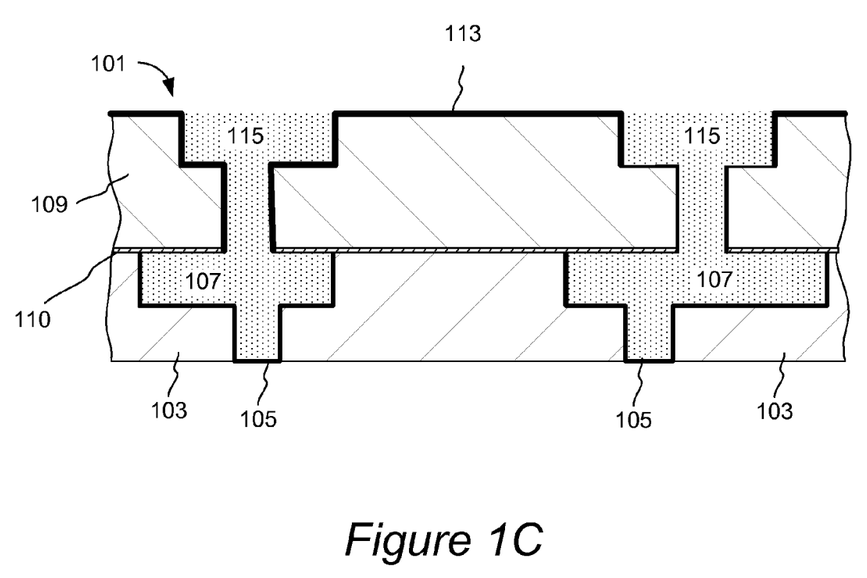
Figure 3A:
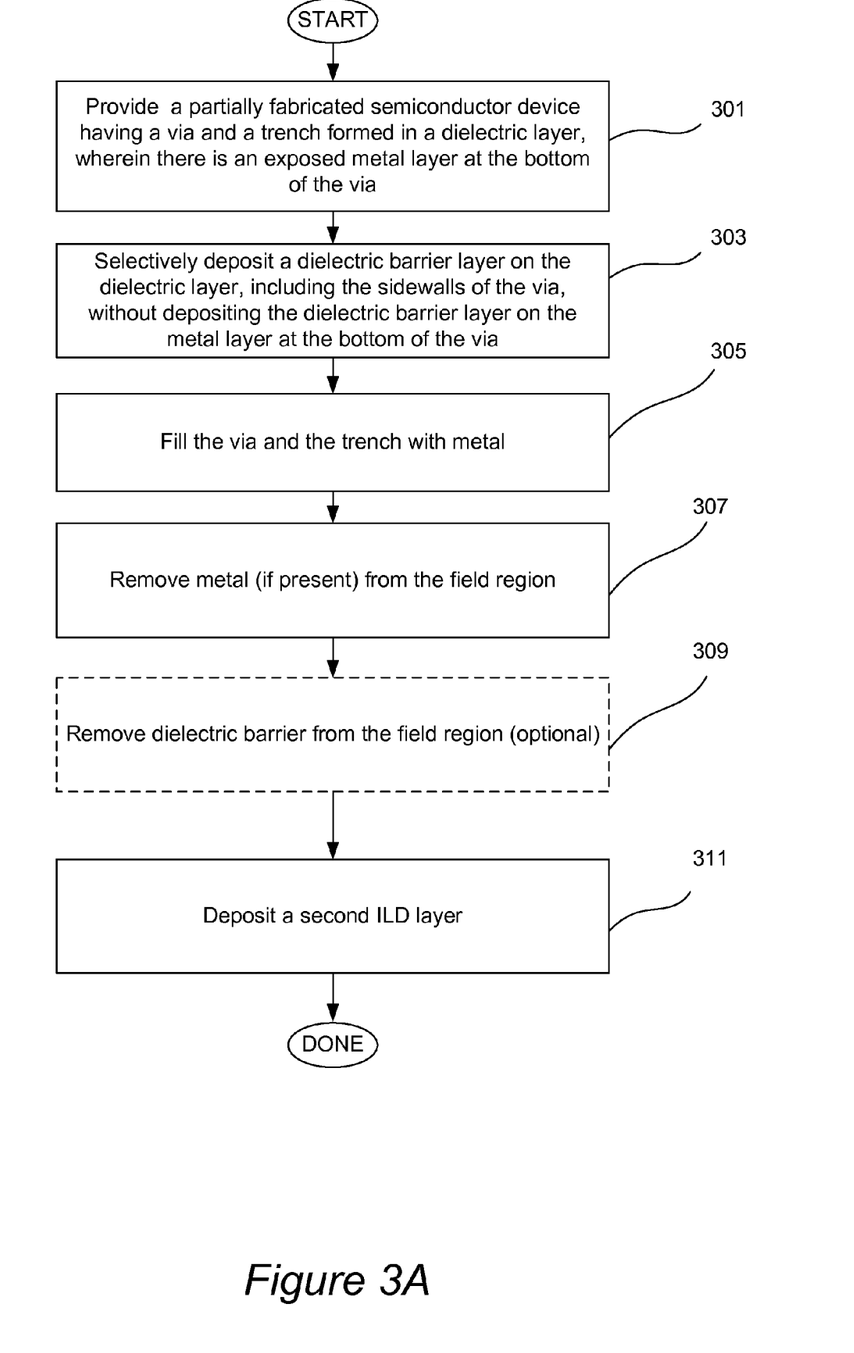
FIG. 3A presents an illustrative process flow diagram for semiconductor device processing according to some embodiments provided herein.

The implementation that involves selective deposition of dielectric barrier is illustrated by cross-sectional diagrams of partially fabricated semiconductor substrate shown in FIGS. 1A-1C and in the process diagram shown in FIG. 3A. "Semiconductor substrate" as used herein is not limited to the semiconductor portions of an IC device, but is broadly defined as a semiconductor-containing substrate. Referring to FIG. 3A, the process starts in 301, by providing a semiconductor device having a dielectric layer and a via and an overlying trench etched into the dielectric layer, wherein there is metal exposed at the bottom of the via. FIG. 1A provides a cross-sectional depiction of one such substrate 101. The substrate includes a first ILD layer 103 composed of low-k dielectric material, such as a porous silicon oxide-based dielectric, and copper lines 107 embedded into the ILD layer 103. A thin diffusion barrier layer 105 resides at the interface between the ILD layer 103 and the copper lines 107, preventing diffusion of copper into the dielectric. The diffusion barrier layer 105 may be a traditional metal-based layer containing one or more of Ta, Ti, W, TaN, TiN, WN, or, in some embodiments, layer 105 is a dielectric barrier layer provided herein, such as doped or undoped silicon carbide or silicon nitride layer. A second ILD layer 109, typically also a low-k dielectric layer, resides over the first ILD layer 103 and is separated from it by a thin etch stop or diffusion barrier layer 110 (e.g., silicon carbide or silicon nitride based layer), which prevents diffusion of copper from copper lines 107 into the top ILD layer 109. Vias 111 are formed in the ILD layer 109, such that the underlying copper 107 is exposed at the bottoms of the vias. Trenches 112 are etched over the vias 111.

In order to ensure conductivity through the via between the lower and upper metallization layers, in the embodiment presented in FIG. 3A, a dielectric diffusion barrier is selectively deposited on the dielectric in operation 303, without being deposited on the metal at the via bottom. The resulting structure is shown in FIG. 1B, where the selectively deposited dielectric barrier layer 113 coats the ILD layer 109 on the sidewalls of the vias 111, on the bottoms and sidewalls of the trenches 112, and on the field region of the device, while the exposed metal 107 at the bottom of the vias is not coated by the dielectric barrier. Next, referring to FIG. 3A, the vias 111 and trenches 112 are filled with metal in operation 305. For example, the vias may be filled with copper using electroplating methods, after a thin seed layer of metal is deposited onto the substrate surface. In another example, the vias may be filled with cobalt or copper or another metal using electroless deposition. When the vias and trenches are filled, in some cases, a layer of unwanted metal overburden is concurrently deposited over the trenches and in the field region of the substrate. In these cases, in operation 307, the unwanted metal is removed, for example, by a chemical mechanical polishing (CMP) method. The resulting partially fabricated structure is shown in FIG. 1C. In this example copper layer 115 fills the vias and is in direct contact with the underlying copper layer 107. The dielectric barrier layer 113 resides at the interface between the ILD layer 109 and the copper layer 115. In the illustrated example, copper overburden has been removed from the field region, and the dielectric diffusion barrier 113 remains on the field region of the substrate. Referring again to the process diagram of FIG. 3A, in operation 309, the dielectric barrier is optionally removed from the field region of the substrate, e.g., by subsequent CMP. It is noted that in some embodiments, the dielectric barrier on the field region may remain, and may serve as a diffusion barrier or an etch stop layer during formation of the subsequent metallization layer. Referring again to the process illustrated in FIG. 3A, in the subsequent operation 311, a new layer of ILD material is deposited over the substrate.

In some cases it may be difficult to achieve complete selectivity in deposition of the dielectric barrier layer. In these cases selective formation of dielectric barrier layer is achieved by non-conformal deposition of the barrier material followed by etching that is configured to remove the dielectric barrier overlying the metal at the via bottom, without fully removing barrier material residing over the dielectric. In some embodiments, the thickness of dielectric barrier deposited on a horizontal ILD surface (e.g., field region or a trench bottom) is at least 1.5, more preferably at least 2 times greater than the thickness of dielectric barrier deposited over the metal at the via bottom. This method is illustrated by the process flow diagram shown in FIG. 3B, and by the illustrative devices in the process of fabrication shown in FIGS. 2A-2D.

Figure 2A:
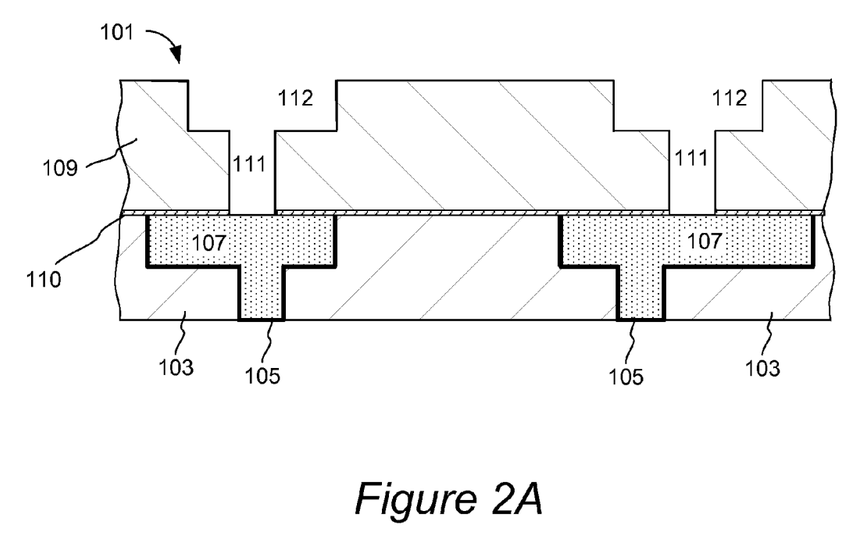
FIGS. 2A-2D show cross-sectional depictions of IC device structures created during device fabrication process, according to an embodiment provided herein.
Figure 2B:
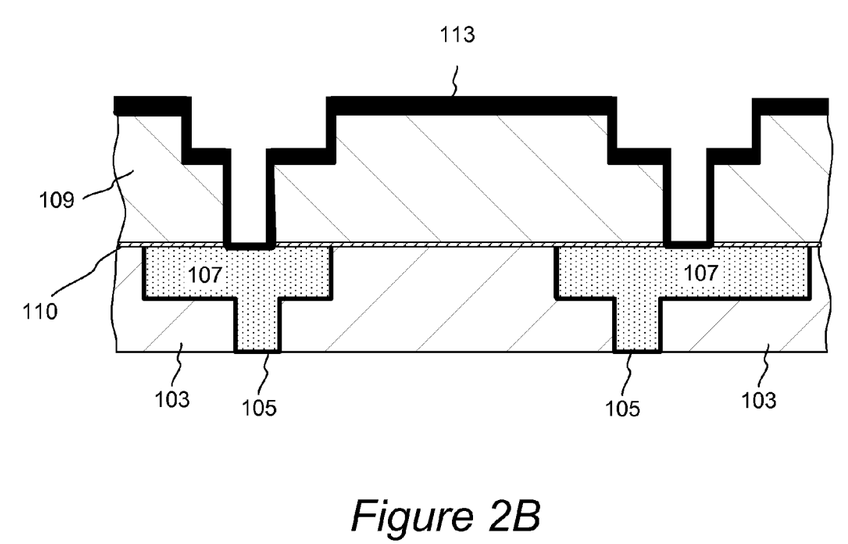
Figure 2C:
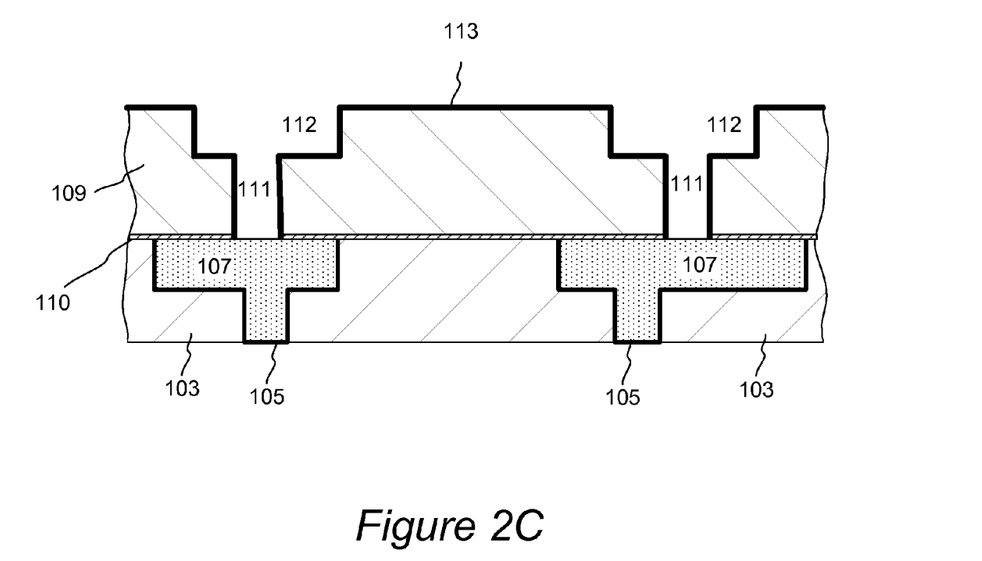
Figure 2D:
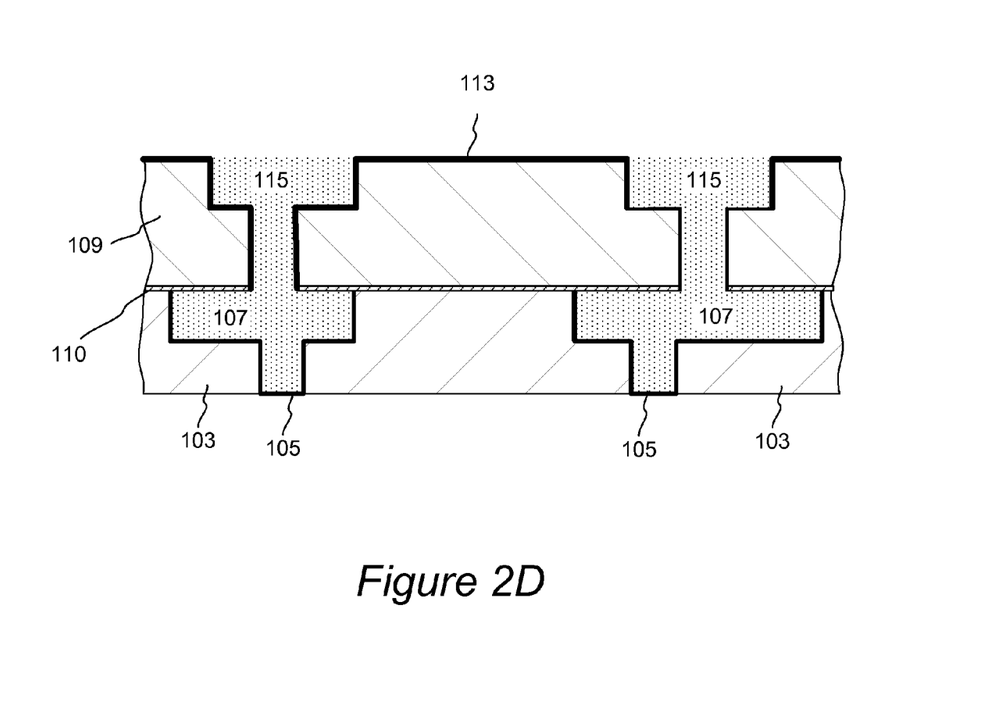
Figure 3B:
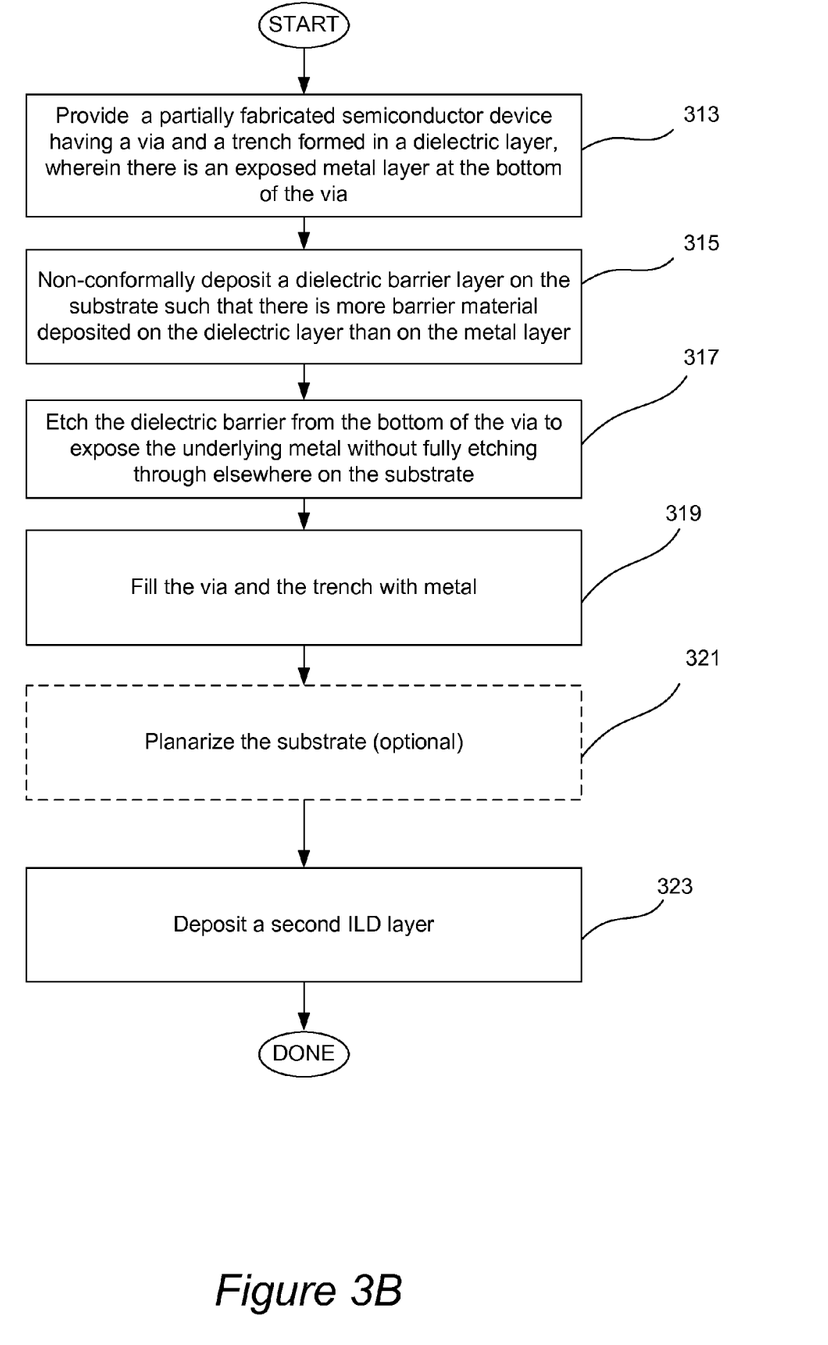
FIG. 3B presents an illustrative process flow diagram for semiconductor device processing according to some embodiments provided herein.

Referring to FIG. 3B, the process starts in 313 similarly to the previously described process shown in FIG. 3A, by providing a partially fabricated semiconductor device having a via and a trench formed in a dielectric layer, wherein there is metal at the bottom of the via. An example of such partially fabricated semiconductor device is shown in FIG. 2A. Next, in operation 315, the dielectric barrier is deposited on the substrate non-conformally, such that there is more dielectric barrier material deposited on the dielectric than on the metal layer at the bottom of the via. The resulting structure is shown in FIG. 2B, which illustrates dielectric barrier 113 deposited over all surfaces of the substrate (including the field region, trench sidewalls, trench bottom, via sidewalls, and via bottom), where the thickness of the barrier over the dielectric on the field region is greater than the thickness of the barrier over the metal at the via bottom. In some embodiments, the thickness of the barrier deposited over the dielectric surface of the via and trench sidewalls, and trench bottom is also greater than the thickness of the barrier deposited over the metal at the via bottom. Next, in operation 317 the dielectric barrier is etched at the bottom of the via to expose the underlying metal layer, without fully etching through elsewhere on the substrate, and without exposing the ILD layer. The structure obtained after etching is shown in FIG. 2C, which shows that the layer of dielectric barrier 113 is completely removed at the bottom of the via exposing the metal layer 107, and is concurrently thinned in the field region and trench bottom. After the etch, the barrier material still covers the sidewalls of the via and the trench, the bottom of the trench, and the field region. Suitable material removal methods depend on the type of dielectric barrier that is used. For example silicon nitride can be removed by F-containing plasma etch process. Next, processing is performed similarly to the process described in FIG. 3A. In the step 319, the via is filled with metal, and then in step 321 the substrate is optionally planaraized, e.g., to remove metal overburden (if present) resulting in a structure shown in FIG. 2D. Optionally the dielectric barrier layer may be removed from the field region. Next, in operation 323, a second layer of interlayer dielectric is deposited over the substrate, e.g., using CVD or a spin-on method.

Selectivity

The selectivity of deposition of the dielectric barrier layer can be achieved using a variety of methods. In some embodiments the dielectric barrier material is deposited selectively on the dielectric surfaces of the substrate without being deposited at the via bottom. In other embodiments, the dielectric barrier is deposited non-conformally, such that more dielectric barrier is deposited on the dielectric surfaces than on the metal at the via bottom. The material at the via bottom then can be removed by etching, without fully removing the barrier material elsewhere on the substrate.

In some embodiments, selectivity of deposition is enhanced by using deposition precursor molecules that contain two or more (more preferably all) of the elements that are present in the resultant dielectric film. For example, in this embodiment, for deposition of SiCN layer, silicon-containing molecules containing Si and C, and more preferably Si, C, and N are used. Examples of suitable precursors include aminosilanes (e.g., bis-dimethylaminomethylsilane) and carbon-containing silazanes. Similarly, for deposition of SiCO layers, precursors containing Si, C, and O, such as alkoxysilanes, and carbon-containing siloxanes are preferred. For deposition of SiCNO layers, mixtures of precursors containing at least two (preferably at least three) of Si, C, N, O elements), such as mixtures of aminosilanes and alkoxysilanes, can be used. In one of the embodiments, a method of selectively or non-conformally depositing the dielectric diffusion barrier layer includes: (a) providing a substrate having a via and a trench in an ILD layer, wherein there is an exposed metal at the bottom of the via; (b) forming a plasma in a process gas (e.g., $H_2$) in a separate plasma chamber that does not house the substrate; (c) providing radicals formed in the plasma to a process chamber housing the substrate through a feed conduit and allowing the radicals to adsorb on the substrate; (d) providing a precursor containing at least two of the elements (more preferably, at least three of the elements) of the deposited dielectric barrier layer to the process chamber housing the substrate, and allowing the precursor to react with the radicals to form the dielectric diffusion barrier layer selectively or partially selectively (non-conformally).

In some embodiments selective or partially selective deposition is achieved by using processes and process conditions that are configured for this result. For example, in some embodiments, it is preferable to use remote plasma deposition rather than direct plasma deposition because it enhances via sidewall coverage, and generally contributes to enhanced selectivity.

Figure 4A:
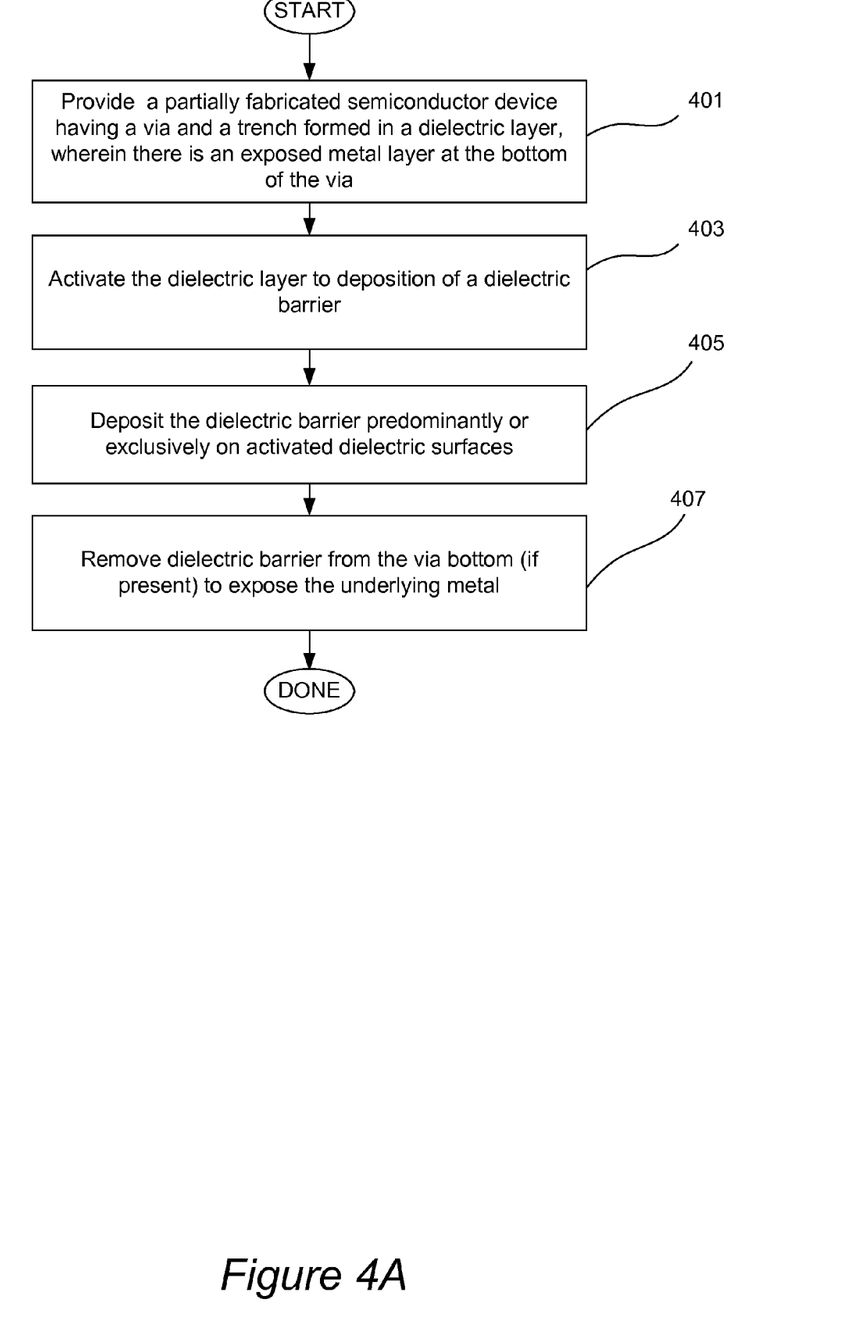
FIG. 4A presents an illustrative process flow diagram for selective formation of a dielectric diffusion barrier according to an embodiment provided herein.

In some embodiments selective or partially selective deposition of dielectric diffusion barrier is promoted by activating the layer of dielectric exposed on a substrate towards deposition. As shown in the process flow diagram of FIG. 4A the process starts in 401 by providing a partially fabricated semiconductor device having a via formed in a dielectric layer, wherein there is an exposed metal at the bottom of the via. Next, in operation 403 the dielectric layer is activated to deposition of a dielectric barrier. After activation in operation 405, the dielectric barrier is deposited predominantly or exclusively on the activated dielectric layer surfaces. If present at the bottom of the via, the dielectric diffusion barrier material is removed to expose the metal in operation 407.

Figure 4B:
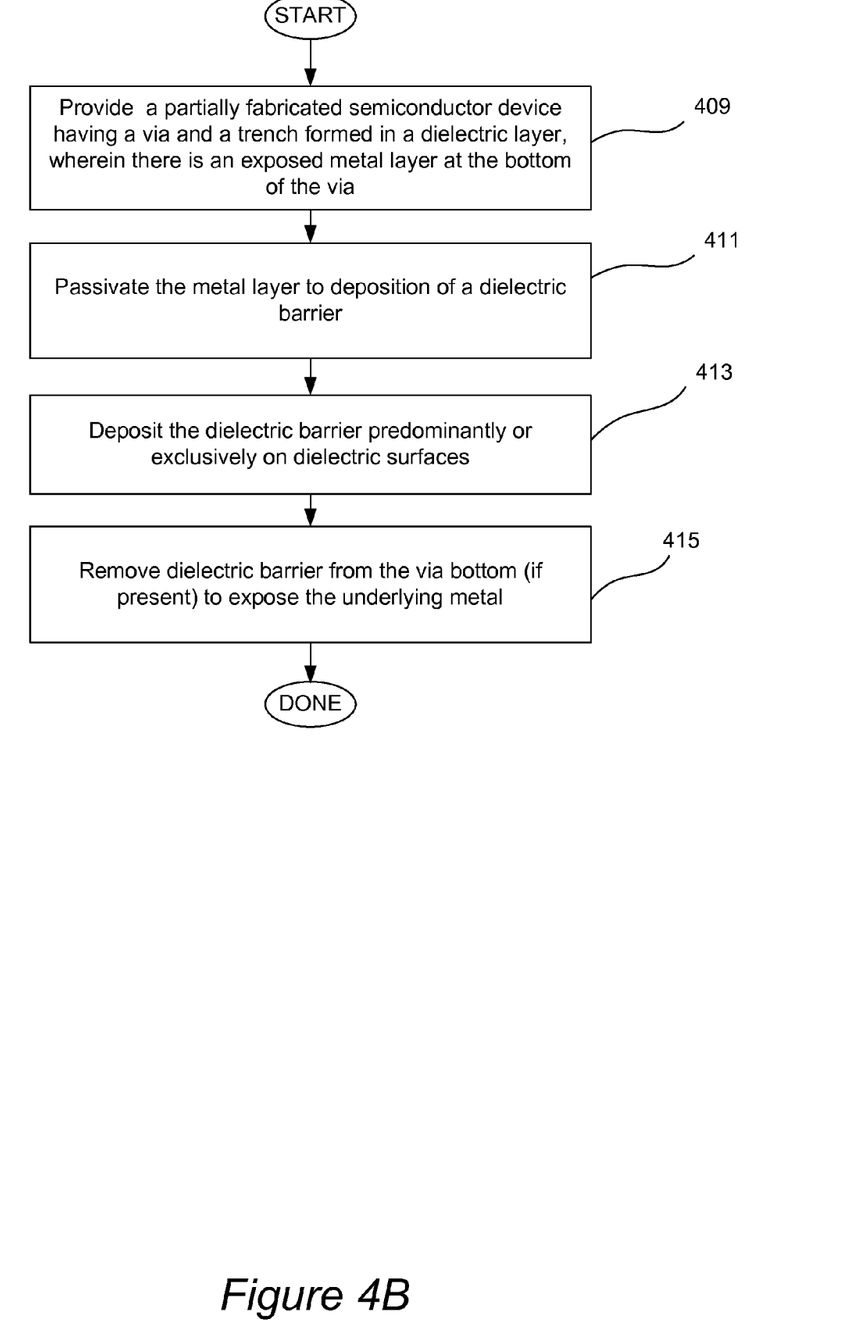
FIG. 4B presents an illustrative process flow diagram for selective formation of a dielectric diffusion barrier according to an embodiment provided herein.

In some embodiments, selective or partially selective deposition of dielectric diffusion barrier is promoted by passivating the layer of metal at a via against deposition of a barrier. As shown in the process flow diagram of FIG. 4B the process starts in 409 by providing a partially fabricated semiconductor device having a via formed in a dielectric layer, wherein there is an exposed metal at the bottom of the via. Next, in operation 411 the metal at the via bottom is passivated against the deposition of a dielectric barrier. After passivation, in operation 413 the dielectric barrier is deposited predominantly or exclusively on the activated dielectric layer surfaces. If present at the bottom of the via, the dielectric diffusion barrier material is removed to expose the metal in operation 415.

For example, in some embodiments a substrate containing copper at the via bottom is provided. The copper is then passivated by forming a layer of copper nitride on its surface, e.g., by contacting the substrate with a nitrogen-containing gas in a plasma.

Other types of selectivity-enhancing treatments include thermal treatment, UV treatment, remote plasma treatment and direct plasma treatment. One or more of these types of treatments can be performed prior to deposition of any of the dielectric diffusion barrier layers described herein to enhance selectivity, but are particularly suitable to be performed prior to CVD or ALD deposition of metal nitrides (e.g., AlN), and metal carbides (e.g., WC). In one example of a thermal treatment, the substrate containing an exposed ILD layer and an exposed metal layer at the via bottom is heated in an absence of plasma, preferably in a presence of a reducing gas, such as hydrogen at a temperature of at least about 300° C. In one implementation of a UV treatment the substrate is irradiated with UV light using a UV lamp, in a presence of a reducing gas, such as ammonia at a temperature of at least about 300°

C. In one implementation of a remote plasma treatment, the substrate is contacted with $NH_x$ radicals that are remotely generated by forming a plasma in a separate chamber charged with $NH_3$, and are then provided to the process chamber housing the substrate. In one implementation of direct plasma treatment, the substrate is treated with a plasma formed in the process chamber housing the substrate, where the plasma is formed in a process gas containing one or more of $NH_3$ and $N_2$.

In one example of a metal-passivating selectivity-enhancing treatment, a substrate containing an exposed ILD layer and exposed metal (e.g., copper) at the bottom of a via made in the ILD layer is provided. The substrate is contacted with a thiol-containing compound, wherein the thiol-containing compound forms a self-assembled monolayer on the surface of the metal at the bottom of the via. The self-assembled monolayer passivates the metal surface towards deposition of dielectric diffusion barrier. Next, the dielectric diffusion barrier is deposited exclusively or preferentially on the ILD surface. For example SiOC or SiNC dielectric barrier deposited by ALD is a suitable barrier for this embodiment. If present, the dielectric diffusion barrier is removed from the via bottom and then the self-assembled monolayer is removed from the via bottom, e.g., by an anneal (e.g., by heating the substrate at a temperature of at least about 300° C.).

In some implementation, a combination of surface activation and deactivation may be used.

Examples

Silicon-containing dielectric diffusion barriers (such as doped or undoped silicon nitride and silicon carbide) can be deposited predominantly or exclusively on ILD layers by using one or more of the following selectivity-enhancing processing techniques. First, in some embodiments it is preferable to deposit silicon-containing dielectric using a remote plasma deposition. In this deposition method, the plasma is generated remotely in a chamber that is separated from the process chamber housing the substrate. The plasma is generated in a reactant gas that may include one or more of $H_2$, $N_2$, and $NH_3$. The reactant gas in the plasma generation chamber does not include the silicon-containing precursor. After the plasma is generated, the radicals formed in a plasma are transported to the process chamber via a feed conduit and are allowed to adsorb on the surface of the substrate. A silicon-containing precursor is delivered to the process chamber separately from the reactant gas. The silicon-containing precursor reacts with the radicals at the surface of the substrate to form a layer of silicon-containing dielectric material, such as SiCN, SiCO, SiCNO and the like. The use of remote plasma is advantageous because it provides a better via sidewall coverage and also causes less ILD damage than methods that rely on the use of direct plasma. Further, it was found that in order to improve deposition selectivity, it is preferable to use silicon-containing precursors that contain silicon and oxygen, or silicon and nitrogen, or silicon, nitrogen, and oxygen in one molecule. The suitable precursors include aminosilanes, alkoxysilanes, carbon-containing silazanes, carbon-containing siloxanes and mixtures thereof. For example, SiCN in these embodiments can be deposited using an aminosilane (e.g., bis-dimethylaminomethylsilane) or a silazane. SiCO can be deposited using an alkoxysilane or a siloxane as a precursor. SiCNO can be deposited using a mixture of an alkoxysilane and an aminosilane. Use of these types of molecules (as opposed to silanes and alkylsilanes modified by ammonia in a plasma) results in a more surface-controlled reaction with the radicals, which in turn leads to increased selectivity. In some embodiments, the concentration of radicals is increased to improve selectivity by using higher flow rates of reactant gases, and by using higher power for the generation of remote plasma. Other parameters that improve deposition selectivity include lower pressure in the process chamber, and lower flow rate of the silicon-containing precursor. For example, in some embodiments improved selectivity can be achieved by providing a reactant gas (e.g., $H_2$) at a flow rate of between about 5-20 slm, forming a plasma remotely in a chamber containing the reactant gas using a power of between about 1-3 kW (e.g., HF plasma generated using 13.56 MHz frequency can be used), providing a silicon-containing precursor (e.g., a precursor containing both silicon and nitrogen atoms, such as bis-dimethylaminomethylsilane) at a flow rate of between about 1-50 sccm (the precursor can be introduced alone; in some embodiments a noble carrier gas is added) and conducting deposition at a temperature of between about 100-500° C. and at a pressure of between about 0.5-5 Torr. For example, SiCN can be deposited selectively or non-conformally using process conditions described above by remote plasma deposition with $H_2$ used as a reactant gas, and an aminosilane (e.g., bis-dimethylaminomethylsilane) used as a silicon-containing precursor.

Silicon-containing dielectric barriers can be etched, when necessary using a fluoro-based plasma etch. For example etching can be performed by generating a plasma in a process gas containing a fluorocarbon or a fluorohydrocarbon (e.g., one or more of $C_4F_8$, $CF_4$, $C_2F_6$, $CHF_3$, $CF_2H_2$, and $C_4F_6$) and a second gas such as Ar, He, $O_2$, $N_2$ and $CO_2$ and contacting the substrate with the radicals generated in a plasma to etch the dielectric barrier at the bottom of the via without exposing ILD. In one example, the plasma is generated using dual frequency plasma using power level of between about 200-3000 W for 2 MHz generator and using power level of between about 300-3000 W for 27 MHz generator. The etch can be performed at a pressure of between about 50 mTorr and 5 Torr.

Boron-containing dielectric diffusion barrier layers can be deposited similarly to silicon-containing dielectric diffusion barriers described above, but with the use of a boron-containing precursor, such as borane, using PECVD, and more preferably remote plasma CVD methods. Any of the described selectivity-enhancing surface pretreatments can be performed prior to deposition of boron-containing layers. Examples of suitable deposition conditions for boron-containing layers can be found in the U.S. Pat. No. 7,842,604 by Yu et al. issued on Nov. 30, 2010, which is herein incorporated by reference.

Metal oxide and metal silicate diffusion barrier layers can be selectively deposited by blanketly depositing metal over the substrate and then in some cases annealing it to form an oxide or a silicate. Metal (e.g., titanium or manganese) can be deposited by any suitable method, such as by PVD or ALD, such that it is present both at the via bottom and over ILD on the substrate. However, either spontaneously upon contact with dielectric or upon annealing at high temperature, the metal deposited on the dielectric can form oxide (e.g., titanium is oxidized by silicon-oxide based dielectric to $TiO_x$), or silicate (manganese can react with the dielectric to form MnSiO), while metal remaining at the via bottom remains unoxidized because it does not come into contact with the dielectric. Therefore a dielectric diffusion barrier (metal oxide or silicate) is selectively formed over ILD without being formed over metal at the via bottom, where conductive layer of deposited metal remains. Examples of deposition conditions for deposition of self-formed titanium oxide are presented in the U.S. Pat. No. 7,727,882 by Wu et al., issued on Jun. 1, 2010, which is herein incorporated by reference. It is noted that in the embodiments provided herein, unlike those presented in Wu, the diffusion barrier layer does not include titanium nitride.

Metal carbides and metal carbonitrides are deposited in some embodiments using ALD methods that involve sequentially contacting the substrate with a suitable organometallic compound (e.g., metal carbonyl) and a reducing agent with or without plasma assistance. Preferably, to enhance selectivity, surface pre-treatments, such as UV pre-treatment, remote plasma pre-treatment, thermal pre-treatment, or direct plasma pre-treatment are performed prior to deposition. For example WC can be deposited by ALD by using an organotungsten compound (e.g. $W(CO)_6$, bis(tert-butylimido)-bis-(dimethylamido)tungsten (BTBMW) or methylcyclopentadienyl-dicarbonylnitrosyltungsten (MDNOW)). Examples of process conditions suitable for deposition of WC can be found for example in the US Patent application Publication No. 2009/0163025 published on Jun. 25, 2009 by Humayun et al., which is herein incorporated by reference. The selectivity to deposition can be conferred by the selectivity-enhancing pre-treatments described herein.

Aluminum nitride dielectric diffusion barrier layers can be deposited predominantly or exclusively on ILD layers by using one or more of the following surface pre-treatments and deposition techniques. It is note that surface pre-treatment conditions described below in the context of AlN deposition can be used to enhance selectivity of deposition of any of the layers described herein.

In some embodiments, UV pre-treatment of the substrate is used to enhance selectivity of AlN deposition. In some embodiments, the substrate is irradiated by UV light in the presence of ammonia provided at a flow rate of between about 2.5-10 slm, at a temperature of between about 300-400° C. and at a pressure of between about 2.4-90 Torr. After pre-treatment, AlN is deposited by CVD or ALD using an organoaluminum precursor and a nitrogen-containing gas (e.g., ammonia). Suitable organoaluminum precursors include trimethylaluminum (TMA) and any of the precursors provided in the U.S. Pat. No. 8,268,722 by Yu et al., issued on Sep. 18, 2012, which is herein incorporated by reference. Suitable deposition conditions include conditions provided in the U.S. Pat. No. 8,268,722 and/or the process described below. The process starts by providing the pre-treated substrate into an ALD process chamber. The substrate is contacted with a mixture of trimethylaluminum and $N_2$, where trimethylaluminum is provided at a flow rate of between about 50-200 sccm and $N_2$ is provided at a flow rate of between about 0.5-2 slm. After the substrate is exposed for several seconds the process chamber is purged to completely or partially remove trimethylaluminum, and then a mixture of $NH_3$ and $N_2$ is introduced at a flow rate of between about 2-10 slm for each gas. The AlN layer is deposited on the substrate. The process chamber is then purged, and the reactant exposure is repeated for as many cycles as necessary to build an AlN film of desired thickness. Deposition can be conducted at a temperature of between about 180-400° C. and at a pressure of between about 1.2-8 Torr.

In one specific example the substrate is irradiated by UV light (at a wavelength of greater than 190 nm and a power of about 3.6 kW) in the presence of ammonia provided at a flow rate of about 5000 sccm. The UV pre-treatment is performed at a temperature of 350° C. and at a pressure of 50 torr. After the UV pre-treatment, AlN is deposited on the substrate using cyclic CVD method. The substrate is first contacted with TMA mixed with $N_2$ (at a flow rate of 90 sccm of TMA and 0.95 slm of $N_2$) at 350° C. and at a pressure of 4 torr. The chamber is then purged to partially remove TMA, and the substrate is contacted with a mixture of $NH_3$ (provided at a flow rate of 7000 sccm) and $N_2$ (provided at a flow rate of 2800 sccm) to form a layer of AlN. The substrate is then purged and is again sequentially dosed with TMA and $NH_3$. The process is performed at a temperature of 350° C. and at a pressure of 4 torr.

Other types of pre-treatments that can enhance selectivity of AlN deposition include thermal pre-treatment, remote plasma pre-treatment, and direct plasma PECVD pre-treatment. In one embodiment of a thermal pre-treatment the substrate is contacted with $H_2$ at a temperature of between about 300-400° C. (such as 350° C.) and at a pressure of between about 2-9 Torr (such as 4 Torr). Hydrogen is supplied into the process chamber at a flow rate of between about 5-10 slm (such as 9500 sccm).

In one embodiment a remote plasma pre-treatment is performed by forming $NH_x$ radicals from $NH_3$ gas using plasma in a remote plasma chamber and supplying the radicals to the process chamber housing the substrate. The $NH_3$ gas is flowed into a remote plasma chamber at a flow rate of between about 250-2500 sccm (such as 800 sccm) and the plasma is formed using 13.56 MHz generator at a power of between about 12000-24000 W. The process is performed at a temperature of between about 150-400° C. and at a pressure of between about 0.5-2.5 Torr. In one example, remote plasma pre-treatment is performed at a pressure of 0.5 Torr, temperature of 350° C., generating plasma using a power of 2400 W. In another example, remote plasma pre-treatment is performed at a pressure of 1.5 Torr, temperature of 150° C., generating plasma using a power of 1200 W.

In one embodiment a direct plasma pre-treatment is performed by forming plasma in a gas containing $NH_3$ and $N_2$ in the chamber housing the substrate. In some implementations plasma is formed using HF plasma generation provided at a frequency of about 13.56 MHz at a power of between about 350-750 W (e.g., 600 W), optionally with an LF component using 400 kHz frequency at a power of between about 0-750 W. In one implementation plasma pre-treatment is performed at a temperature of about 350° C. and at a pressure of between about 2-8 Torr (e.g., 2.4 Torr) using $NH_3$ (e.g., provided at a flow rate of 1000 sccm), and $N_2$ (e.g., provided at a flow rate of about 15 slm).

Apparatus

Another aspect of the implementations disclosed herein is an apparatus configured to accomplish the methods described herein. A suitable apparatus includes hardware for accomplishing the process operations and a system controller having instructions for controlling process operations in accordance with the disclosed implementations. Hardware for accomplishing the process operations includes ALD processing chambers, PECVD processing chambers, remote plasma systems, and PVD processing chambers. The system controller will typically include one or more memory devices and one or more processors configured to execute the instructions so that the apparatus will perform a method in accordance with the disclosed implementations. Machine-readable media containing instructions for controlling process operations in accordance with the disclosed implementations may be coupled to the system controller.

Figure 5:
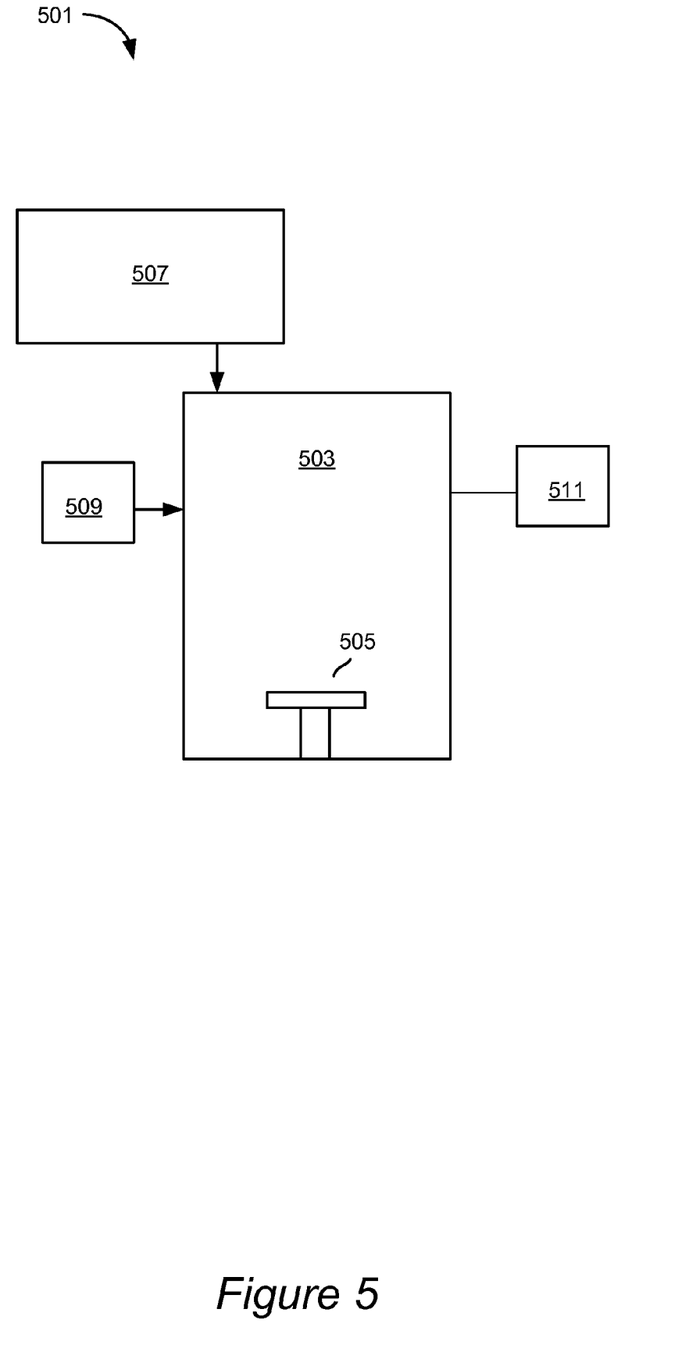
FIG. 5 is a schematic presentation of a remote plasma deposition apparatus suitable for selective deposition of dielectric barrier layers, in accordance with an embodiment provided herein.

In one of implementations, the apparatus for depositing selective or non-conformal (partially selective) dielectric barrier layers is a remote plasma deposition apparatus. A simplified schematic presentation of such apparatus is shown in FIG. 5. The apparatus 501, includes the main process chamber 503, housing the pedestal 505 that is configured to support the substrate during deposition. A separate chamber 507 is associated with a plasma generator, and is configured for forming radicals from process gases, such as $H_2$, in a plasma. The generated radicals are directed through a feed conduit to the main process chamber 503. Separately, a precursor (e.g., a silicon-containing precursor) is directed from the precursor source 509 to the process chamber 503. A controller 511 is electrically connected with the process chamber 503 and is configured to control one or several parameters of the deposition process, such temperature, pressure, power levels applied for plasma generation, and flow rates of process gases and precursors. For example the controller may include program instructions or built-in logic for performing any of the processes described herein.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Mild Processing

While in general, a variety of methods can be used to selectively form dielectric diffusion barriers, in some embodiments it is particularly preferable to use non-damaging mild deposition methods to prevent damage to the ILD layer. This is particularly important when mechanically weak dielectrics, such as porous dielectrics are used. In some embodiments, particularly when ILDs with a dielectric constant of less than 2.5 are used (these are typically not mechanically robust), the deposition methods are configured such as to avoid contact of damaging high-energy ions with the ILD. For example, the dielectric barrier may be deposited with a thermal ALD process, a thermal chemical vapor deposition (CVD) process, a low-power PECVD process, or a remote-plasma PECVD process.

In some implementations the dielectric diffusion barrier layer may be deposited with a thermal ALD process. Thermal ALD processes are usually performed with two different chemicals or precursors and are based on sequential, self-limiting surface reactions. The precursors are sequentially admitted to a reaction chamber in a gaseous state where they contact the surface of the wafer substrate. For example, a first precursor is adsorbed onto the surface when it is admitted to a reaction chamber. Then, the first precursor reacts with a second precursor at the surface when the second precursor is admitted to the reaction chamber. By repeatedly exposing a surface to alternating sequential pulses of the precursors, a thin film of the barrier material is deposited. Thermal ALD processes also include processes in which a surface is exposed to sequential pulses of a single precursor, which also may deposit a thin film of the barrier material on the surface. Thermal ALD generally forms a conformal layer, i.e., a layer that faithfully follows the contours of the underlying surface. By exposing the precursors to a surface repeatedly, a thin dielectric diffusion barrier layer may be deposited. The final thickness of the dielectric diffusion barrier layer depends on the thickness of the precursor absorption layer as well as the number of precursor exposure cycles. A general description of thermal ALD processes and apparatus is given in U.S. Pat. No. 6,878,402, which is herein incorporated by reference.

In some other implementations, the dielectric diffusion barrier layer may be deposited using a low-power PECVD process. In low-power PECVD processes, a radio frequency (RF) power is applied to sustain a plasma discharge when depositing a barrier layer, in some implementations. A dual frequency PECVD system with both high and low radio frequency power supplies can also be used. Low-power PECVD processes utilize a plasma to enhance chemical reaction rates of the precursors. Some low-power PECVD processes allow for the deposition of a material using a low-power RF power, which may result in little or no damage to an exposed ILD layer on a wafer substrate surface.

In some implementations in which the dielectric diffusion barrier layer is deposited using a low-power PECVD process, the plasma is a low-power plasma. The RF power used to generate the plasma may be applied at a power of less than about 100 W for a 300 millimeter wafer substrate, in some implementations. In some implementations, the RF power used to generate the plasma may be about 25 W to 150 W. A general description of PECVD processes and apparatus in which a low-power plasma may be used is given in U.S. patent application Ser. No. 12/070,616, entitled "PLASMA PARTICLE EXTRACTOR FOR PECVD," and filed Feb. 19, 2008, which is herein incorporated by reference.

In some implementations, the dielectric barrier layer may be deposited using a remote-plasma PECVD process or a remote-plasma ALD process. In a remote-plasma PECVD process or a remote-plasma ALD process, the plasma may be generated with a remote plasma source. The use of a plasma generated with a remote-plasma source may minimize or substantially eliminate damage to the wafer substrate that may be caused by a plasma. Remote-plasma PECVD processes and remote-plasma ALD processes are similar to direct PECVD processes except that the work piece (e.g., the wafer substrate) is not directly in the plasma source region. The plasma source is upstream from the wafer substrate, and activates and/or disassociates precursor species to form reactive ions and radicals. Reducing gasses, including ammonia and hydrogen, are also dissociated into reactive ions and radicals within the remote plasma source in some implementations. In some implementations a showerhead and a faceplate can be used to filter out ions such that only radicals reach the wafer substrate surface. Radicals may cause little damage to an ultralow-k dielectric. Further, removing the wafer substrate from the area of the plasma source may allow for processing temperatures down to about room temperature. A general description of remote-plasma PECVD processes and apparatus is given in U.S. Pat. No. 6,616,985 and U.S. Pat. No. 6,553,933, both of which are herein incorporated by reference. In some implementations, a remote-plasma source also may be used in ALD-type processes for the deposition of a dielectric barrier layer in some implementations.

Experimental Example

SiNC dielectric barrier was selectively deposited on the dielectric layer without being deposited on an exposed copper layer at the bottom of the via. Specifically the SiNC layer was deposited on a substrate containing 35-nm wide recessed features having aspect ratio of 3:1. The surface of the substrate was composed of exposed TEOS and SiN and contained exposed copper at the bottom of the vias. The SiNC layer was deposited selectively on the ILD layer and was not deposited on copper in the via bottoms by using remote plasma CVD. Plasma was generated remotely using HF frequency of 13.56 MHz and a power level of 2.5 kW. Plasma was formed in an H$_2$ reactant gas provided at a flow rate of 10 slm. The plasma-generated radicals were provided to the process chamber. Separately, the silicon-containing precursor (bis-dimethylaminomethylsilane) was provided to the process chamber at a flow rate of 20 sccm. Deposition was performed at a temperature of 400° C. and at a pressure of 1.5 Torr. After SiNC was selectively deposited, cobalt was deposited to fill the vias by electroless deposition using a deposition chemistry described in the U.S. Pat. No. 6,794,288 by Kolics et al. issued Sep. 21, 2004, which is herein incorporated by reference. The fact that electroless cobalt was successfully deposited confirms that SiNC was selectively deposited on the ILD layer, and was not deposited on the copper at the bottom of the via, because cobalt would not grow on a dielectric layer in an electroless process.

Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The invention claimed is:

1. A method of processing a semiconductor substrate, the method comprising:
   (a) providing a partially fabricated semiconductor substrate having an exposed layer of dielectric, and a via formed in the layer of dielectric, wherein there is an exposed layer of metal at the bottom of the via; and
   (b) selectively forming a dielectric diffusion barrier layer on the exposed layer of dielectric, wherein the dielectric diffusion barrier material is selected from the group consisting of doped or undoped silicon carbide and doped or undoped silicon nitride, wherein (b) comprises using a method selected from the group consisting of:
      (i) selectively depositing the dielectric diffusion barrier material on the layer of dielectric without depositing dielectric diffusion barrier layer on the layer of metal; and
      (ii) depositing the dielectric diffusion barrier material on the exposed layer of dielectric while depositing less dielectric diffusion barrier material on the exposed metal layer and thereby achieving partial selectivity, and subsequently removing the dielectric diffusion barrier material over the layer of metal by etching without fully removing the dielectric diffusion barrier material over the layer of dielectric.

2. The method of claim 1, wherein the dielectric diffusion barrier material has a dielectric constant of between about 3.0-20.0.

3. The method of claim 1, wherein the dielectric diffusion barrier material is SiNC.

4. The method of claim 1, wherein the semiconductor substrate provided in (a) further comprises a trench over the via.

5. The method of claim 1, further comprising after (b):
(c) filling the via with a metal, such that the filling metal is in contact with the metal layer at the bottom of the via; and
(d) after (c), removing excess metal present on a field region of the semiconductor substrate.

6. The method of claim 5, further comprising:
after (b) and before (c) conformally depositing a conductive liner to promote adhesion between the dielectric diffusion barrier material formed in (b), and the metal filling the via deposited in (c).

7. The method of claim 1, wherein (b) comprises depositing the dielectric diffusion barrier material using a precursor that contains two or more of the elements that are present in the resultant dielectric diffusion barrier material.

8. The method of claim 7, wherein (b) comprises depositing a SiCN dielectric diffusion barrier material using an aminosilane, or a carbon-containing silazane as a precursor.

9. The method of claim 7, wherein (b) comprises depositing a SiCO dielectric diffusion barrier material using a precursor that comprises Si, C, and O atoms.

10. The method of claim 1, wherein (b) comprises pretreating the exposed surface of the semiconductor substrate to activate the exposed dielectric layer and/or to passivate the exposed metal layer towards deposition of the dielectric diffusion barrier material.

11. The method of claim 1, wherein the exposed metal layer comprises copper.

12. The method of claim 1, further comprising:
applying photoresist to the substrate;
exposing the photoresist to light;
patterning the photoresist and transferring the pattern to the substrate;
and selectively removing the photoresist from the substrate.

13. A method of processing a semiconductor substrate, the method comprising:
(a) providing a partially fabricated semiconductor substrate having an exposed layer of dielectric, and a via formed in the layer of dielectric, wherein there is an exposed layer of metal at the bottom of the via; and
(b) selectively forming a dielectric diffusion barrier layer on the exposed layer of dielectric, wherein (b) comprises using a method selected from the group consisting of:
(i) selectively depositing the dielectric diffusion barrier material on the layer of dielectric without depositing dielectric diffusion barrier layer on the layer of metal; and
(ii) depositing the dielectric diffusion barrier material on the exposed layer of dielectric while depositing less dielectric diffusion barrier material on the exposed metal layer and thereby achieving partial selectivity, and subsequently removing the dielectric diffusion barrier material over the layer of metal by etching without fully removing the dielectric diffusion barrier material over the layer of dielectric,
wherein (b) comprises:
forming a plasma in a process gas in a separate plasma chamber that does not house the semiconductor substrate;
providing radicals formed in the plasma to a process chamber housing the semiconductor substrate through a feed conduit and allowing the radicals to adsorb on the semiconductor substrate; and
providing a precursor containing at least two of the elements of the deposited dielectric diffusion barrier layer to the process chamber housing the semiconductor substrate, and allowing the precursor to react with the radicals to form the dielectric diffusion barrier layer selectively or partially selectively.

14. The method of claim 13, wherein the process gas comprises $H_2$.

15. The method of claim 13, wherein the precursor is an aminosilane and the formed dielectric diffusion barrier material is SiCN.

16. A method of processing a semiconductor substrate, the method comprising:
(a) providing a partially fabricated semiconductor substrate having an exposed layer of dielectric, and a via formed in the layer of dielectric, wherein there is an exposed layer of metal at the bottom of the via; and
(b) selectively forming a dielectric diffusion barrier layer on the exposed layer of dielectric, wherein the dielectric diffusion barrier material is AlN, wherein (b) comprises using a method selected from the group consisting of:
(i) selectively depositing the dielectric diffusion barrier material on the layer of dielectric without depositing dielectric diffusion barrier layer on the layer of metal; and
(ii) depositing the dielectric diffusion barrier material on the exposed layer of dielectric while depositing less dielectric diffusion barrier material on the exposed metal layer and thereby achieving partial selectivity, and subsequently removing the dielectric diffusion barrier material over the layer of metal by etching without fully removing the dielectric diffusion barrier material over the layer of dielectric.

17. The method of claim 16, wherein (b) comprises pretreating the exposed surface of the semiconductor substrate to activate the exposed dielectric layer and/or to passivate the exposed metal layer towards deposition of the dielectric diffusion barrier material.

18. The method of claim 17, wherein the dielectric diffusion barrier material is AlN deposited using trimethylaluminum as a precursor.

19. The method of claim 16, further comprising after (b):
(c) filling the via with a metal, such that the filling metal is in contact with the metal layer at the bottom of the via; and
(d) after (c), removing excess metal present on a field region of the semiconductor substrate.

20. The method of claim 19, further comprising:
after (b) and before (c) conformally depositing a conductive liner to promote adhesion between the dielectric diffusion barrier material formed in (b), and the metal filling the via deposited in (c).

* * * * *